United States Patent [19]
Ibok

[11] Patent Number: 5,891,794
[45] Date of Patent: Apr. 6, 1999

[54] OXYGEN-DOPED IN-SITU DOPED AMORPHOUS SILICON MULTILAYER GATE STRUCTURES

[75] Inventor: Effiong E. Ibok, Sunnyvale, Calif.

[73] Assignee: Advanced Micro Devices, Inc., Sunnyvale, Calif.

[21] Appl. No.: 744,137

[22] Filed: Nov. 5, 1996

[51] Int. Cl.$^6$ .................. H01L 21/3205; H01L 21/4763
[52] U.S. Cl. ............................ 438/592; 438/761
[58] Field of Search ................... 437/43, 186, 193, 437/233; 438/257, 263, 264, 593, 592, 585, 761

[56] References Cited

U.S. PATENT DOCUMENTS

| | | | |
|---|---|---|---|
| 4,354,309 | 10/1982 | Gardiner et al. | 437/191 |
| 5,147,813 | 9/1992 | Woo | 437/43 |
| 5,445,982 | 8/1995 | Hwang | 437/43 |

OTHER PUBLICATIONS

Ren et al., "Deposition and Characterization of polysilicon films deposited by rapid thermal processing", Journal of Vacuum Science Technology B 10(3), pp. 1081–1086, May 1992.

*Primary Examiner*—Richard Booth
*Attorney, Agent, or Firm*—H. Donald Nelson

[57] ABSTRACT

A method of manufacturing a semiconductor device to prevent uneven polysilicon gate dopant accumulation at the gate/gate oxide interface. A layer of gate oxide is formed on the surface of the silicon substrate, a layer of amorphous silicon is deposited on the gate oxide and a doped layer of amorphous silicon is deposited on the first layer. The first and second layers are deposited by chemical vapor deposition and an oxygen containing gas is selectively injected into the stream of silicon source gas depositing the first and second layers of amorphous silicon.

8 Claims, 5 Drawing Sheets

OXYGEN-DOPED IN-SITU DOPED AMORPHOUS SILICON MULTILAYER GATE STRUCTURES

BACKGROUND OF THE INVENTION

1. Field of the Invention

This invention relates generally to the manufacture of high performance semiconductor devices and, more particularly, to the manufacture of high performance submicron semiconductor devices and, even more particularly, to a method for the manufacture of high performance submicron semiconductor devices to minimize dopant accumulation at the polysilicon-tunnel oxide interface.

2. Discussion of the Related Art

The semiconductor industry is characterized by the dual requirements of an increase in the speed of integrated circuits and an increase in the speed of integrated circuits and an increase in the density of elements in integrated circuits. Thus, these two requirements have become the two major goals of MOSFET scaling. Increasing the density of elements means, primarily, that smaller channel lengths and widths have to be used. Increasing the speed of integrated circuits means, primarily, that the MOSFET saturation drain current $I_{DSAT}$ must be increased to allow faster charging and discharging of parasitic capacitances. Existing performance models for MOSFETs predicted that a decrease in either the channel length, L, or the gate oxide thickness, $t_{ox}$, would increase $I_{DSAT}$. However, as device were scaled below approximately 2 microns, "short-channel" effects were observed that were not predicted by the existing performance models which were then referred to as "long channel" models. For example, one of the short channel effects that was not predicted by the long channel model was that $I_{DSAT}$ becomes independent of channel length in extremely small MOSFETs and approaches a constant value regardless of any decrease in the channel length. It was also found that decreasing the gate oxide thickness, $t_{ox}$, provided a much greater increase in $I_{DSAT}$ than a concomitant decrease in channel length, L. However, a thinner gate oxide thickness, $t_{ox}$, will cause $I_{DSAT}$ to increase faster to the constant value as the channel length, L, is decreased. Therefore, decreasing the gate thickness, $t_{ox}$, results in an increase in $I_{DSAT}$ in two ways and, therefore, it was determined that it is more advantageous to concentrate on methods to decrease gate oxide thickness rather than on methods to decrease channel length.

As device dimensions continued to decrease, it was discovered that other short-channel effects needed to be addressed. All of the short-channel effects were placed into the following two general categories: (1) the problem of increased leakage current when the MOSFET is off and (2) reliability problems associated with short-channel and thin gate oxide device structures.

The reliability problems that arise in short-channel and thin gate oxide MOSFETs include: (1) thin gate oxide breakdown; (2) device degradation due to hot-carrier effects; and (3) reliability problems associated with interconnects between MOSFETs. The problems that are of interest are the phenomena of thin gate oxide breakdown and the phenomena of device degradation due to contamination of the gate/gate oxide region, and more specifically, the gate/gate oxide interface.

The characteristics of the Si—SiO$_2$ interface in a MOSFET determine, to a significant extent, the functioning of the gate dielectric. Similarly, the interface between the polysilicon gate and the gate oxide determine, to a significant extent, the functioning of the gate dielectric. A study of the structure of the gate/gate oxide interface has resulted in the identification of device degradation effects caused by the accumulation of dopant atoms at the gate/gate oxide interface. In addition, because of defects or faults that exist in prior art devices that are exacerbated by the conventional method of growing a polysilicon. The trend in the semiconductor industry has been to deposit a layer of amorphous silicon in an attempt to obtain conformality of the gate layer over the faults that exist at the gate/gate oxide interface. FIG. 8 illustrates a conventional method of forming a layer of amorphous silicon 802 on the layer of gate oxide 702. A stream of silane, indicated by arrows 800 is directed towards the gate oxide layer 702. A dopant is injected into the silane stream to dope, in situ, the amorphous silicon. As is known in the art, the device is later annealed at a temperature to form polysilicon from the amorphous silicon layer. One such dopant is phosphene which provides phosphorous atoms as the dopant material in the gate. Because the gates have become ultrathin for reasons discussed above, the control of the doping concentrations at various depths in the gate have become very difficult. The ultrathin gates, gate oxide layers, and other elements in the semiconductor device have made problems associated with contaminants more apparent and have made semiconductor devices more susceptible to degradation and failure because of contamination levels that were acceptable in prior devices. The conventional method shown in FIG. 8 introduced phosphene in a concentration to "lightly" dope the amorphous silicon gate material because more than a "lightly" doped material would cause uneven accumulation in an anneal step or a post anneal process. The difficultly of controlling the concentration is primarily due to the fact that the gate is scaled to submicron levels. However, the "lightly" doped gate region has resulted in a P depletion effect in the gate which will affect operating parameters of the device. In memory devices, a high concentration of P degrades the gate oxide and cause devices, such as memory devices, particularly flash memory devices to degrade and fail.

What is needed is a method of manufacturing a semiconductor device that has a properly doped gate without having unwanted dopant concentrations at the gate/gate oxide interface.

SUMMARY OF THE INVENTION

The present invention is directed to a method of manufacturing a semiconductor device. A layer of gate oxide is formed on the surface of a silicon substrate, a first layer of amorphous silicon is deposited on the gate oxide, a second layer of amorphous silicon is deposited on the first layer of amorphous silicon. The second layer of amorphous silicon is appropriately doped with a dopant material.

The deposition of the first layer of amorphous silicon is accomplished by injecting an oxygen containing gas into a stream of silicon source gas directed at the surface of the gate oxide.

The deposition of the second layer of amorphous silicon is accomplished by injecting an oxygen containing gas into a stream of silicon source gas directed at the surface of the surface layer.

The oxygen containing gas is injected into the silane stream to achieve a concentration of oxygen on the order of parts per thousand.

The oxygen containing gas is injected into the silane stream to achieve a concentration of oxygen that substantially avoids the formation of silicon oxide during the deposition of the oxygen containing amorphous silicon to form the first and second layer.

The present invention is better understood upon consideration of the detailed description below, in conjunction with the accompanying drawings. As will become readily apparent to those skilled in this art from the following description there is shown and described a preferred embodiment of this invention simply by way of illustration of the mode best suited to carry out the invention. As it will be realized, the invention is capable of other different embodiments, and its several details are capable of modifications in various, obvious aspects all without departing from the scope of the invention. Accordingly, the drawings and descriptions will be regarded as illustrative in nature and not as restrictive.

BRIEF DESCRIPTION OF THE DRAWINGS

The accompanying drawings incorporated in and forming a part of the specification, illustrate the present invention, and together with the description serve to explain the principles of the invention. In the drawings.

DETAILED DESCRIPTION

Figure 1:
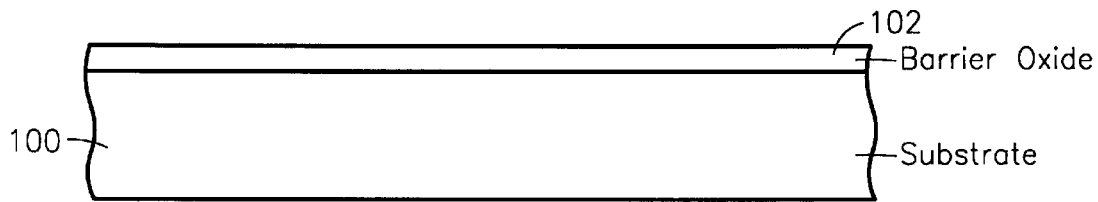
FIG. 1 shows a substrate material with a barrier oxide layer formed thereon.

Referring to FIGS. 1–7, the basic conventional method of manufacturing a MOSFET device is illustrated. FIG. 1 shows a silicon substrate 100 with a barrier oxide layer 102 formed on the silicon substrate 100. The method of forming the barrier oxide layer 102 is well known in the art and will not be discussed. As is known in the art, the primary purpose of the barrier oxide layer 102 is to protect the silicon substrate 100 from contamination during subsequent manufacturing processes.

Figure 2:
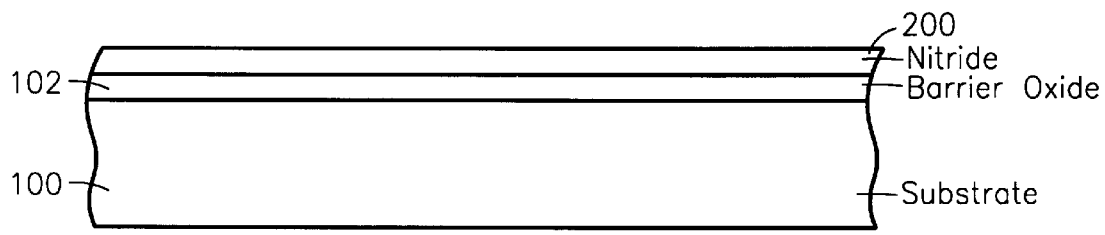
FIG. 2 shows a nitride layer formed on the oxide layer as shown in FIG. 1.

FIG. 2 shows a nitride layer 200 formed on the barrier oxide layer 102. In this and subsequent figures, like numeral designations will be used to indicate like elements. The formation of the nitride layer 200 is also well known in the art and will not be discussed.

Figure 3:
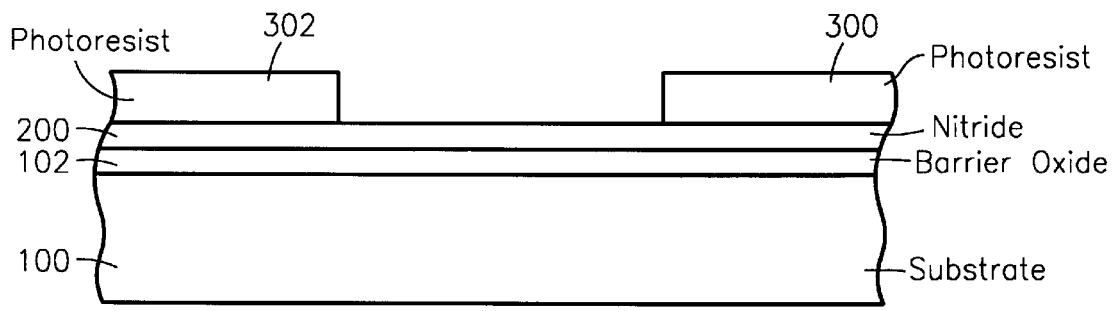
FIG. 3 shows a photoresist pattern formed on the nitride layer as shown in FIG. 2.
Figure 4:
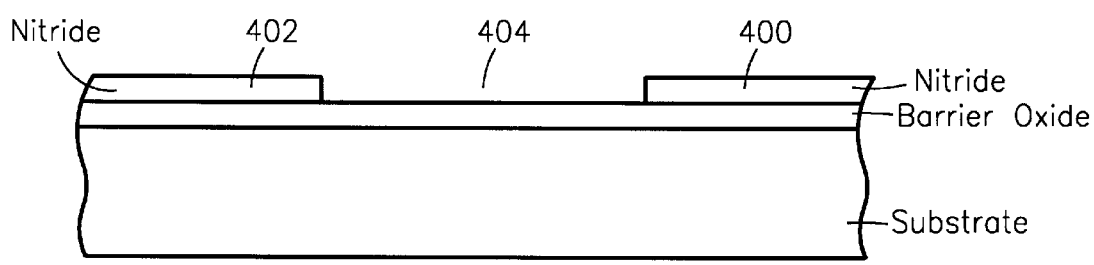
FIG. 4 shows the photoresist removed after the nitride layer has been selectively removed.

FIG. 3 shows a photoresist pattern, represented by photoresist layer portions 300 and 302, that formed on the nitride layer 200. The photoresist pattern allows portions of the nitride layer 200 to be removed as is shown in FIG. 4. This specific photoresist pattern is known as the source/drain mask step and defines the locations at which the source and drain of the MOSFET will be formed in subsequent processes.

FIG. 4 shows the structure shown in FIG. 3 with the photoresist layer portions 300 and 302 removed. It is noted that the portions of the nitride layer 200 that were under the photoresist layer portions 300 and 302 (FIG. 3) are still present, indicated at 400 and 402, and that the portion of the nitride layer 200 that was not protected by the photoresist layer portions 300 and 302 has been removed. The removed portion is indicated at 404 between the remaining portions of the nitride layer 400 and 402.

Figure 5:
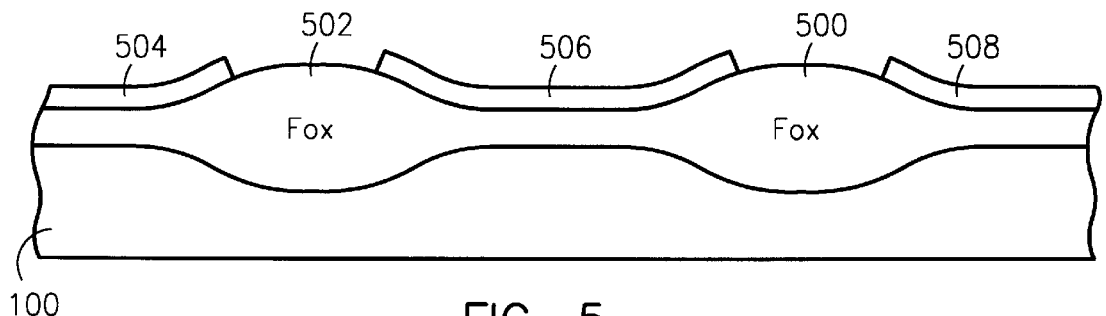
FIG. 5 shows the growth of field oxide (FOX) regions.

FIG. 5 shows regions of field oxide (FOX), indicated at 500 and 502. Also shown are portions of the nitride layer, indicated at 504, 506, and 508, that remain on the structure. It is noted that for clarity and explanation purposes more of the structure is shown in FIG. 5 than is shown in FIG. 4. It is further noted that the field oxide regions, 502 and 504, grow and expand in such a way that the ends of the nitride regions 504, 506, and 508 are elevated.

Figure 6:
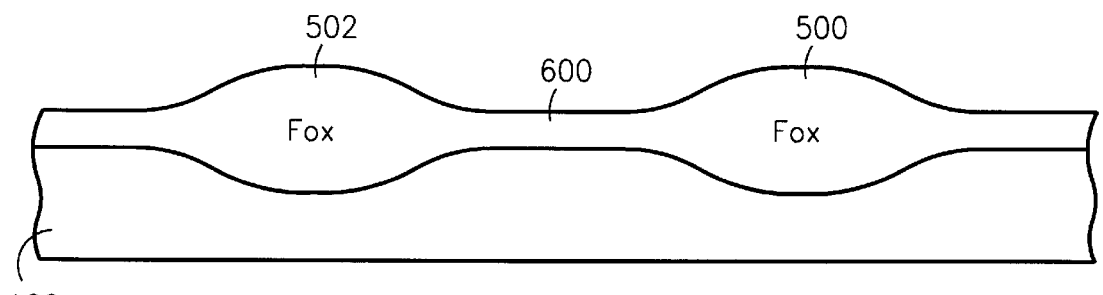
FIG. 6 shows the nitride layer removed after the field oxide regions have been grown.

FIG. 6 shows the structure as shown in FIG. 5 with the portions of the nitride layer removed, leaving only the substrate 100 and the two field oxide regions 502 and 504. The field oxide regions are shown connected by oxide region 600.

Figure 7:
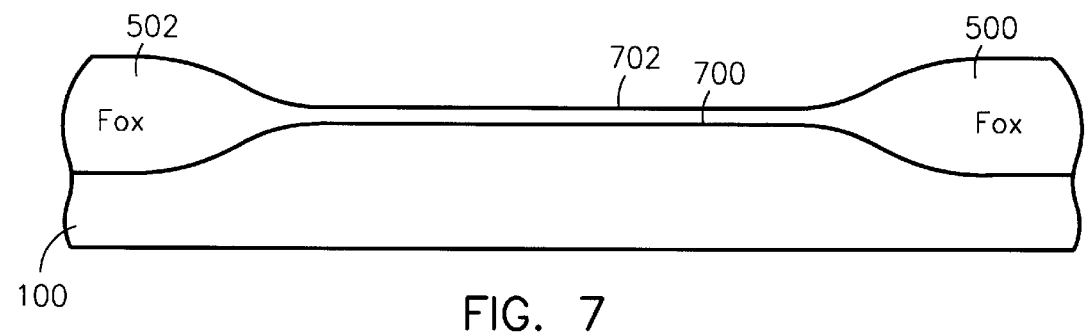
FIG. 7 shows a layer of tunnel or gate oxide formed on the silicon substrate.

FIG. 7 shows a portion of the surface 700 of the silicon substrate 100. For explanation and clarity purposes, the field oxide regions 500 and 502 are shown spread apart in relation to their representation in FIG. 6. It is also noted that none of the figures are to scale and relative sizes of elements between the figures have no significance. A layer of gate oxide 702 is shown formed on the surface 700 of the silicon substrate 100.

Figure 8:
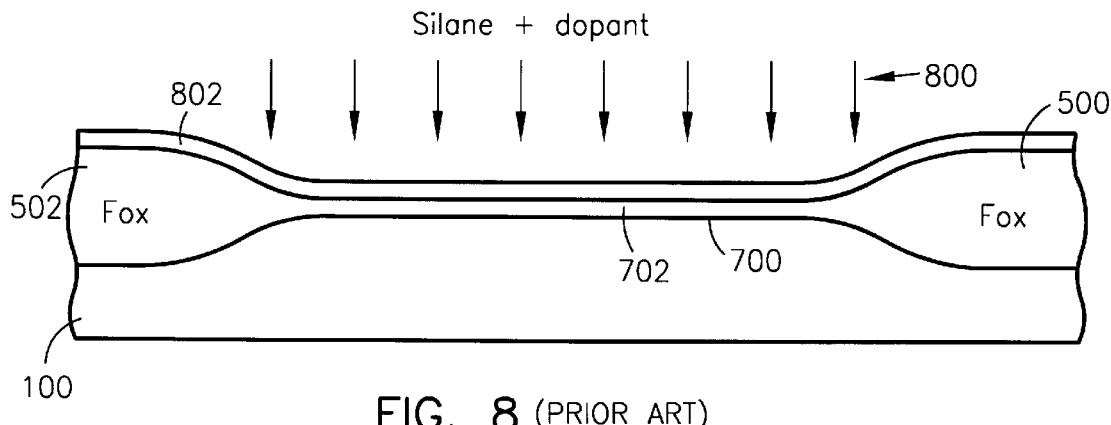
FIG. 8 shows a layer of doped amorphous silicon formed on the tunnel oxide layer as used in the prior art.
Figure 13:
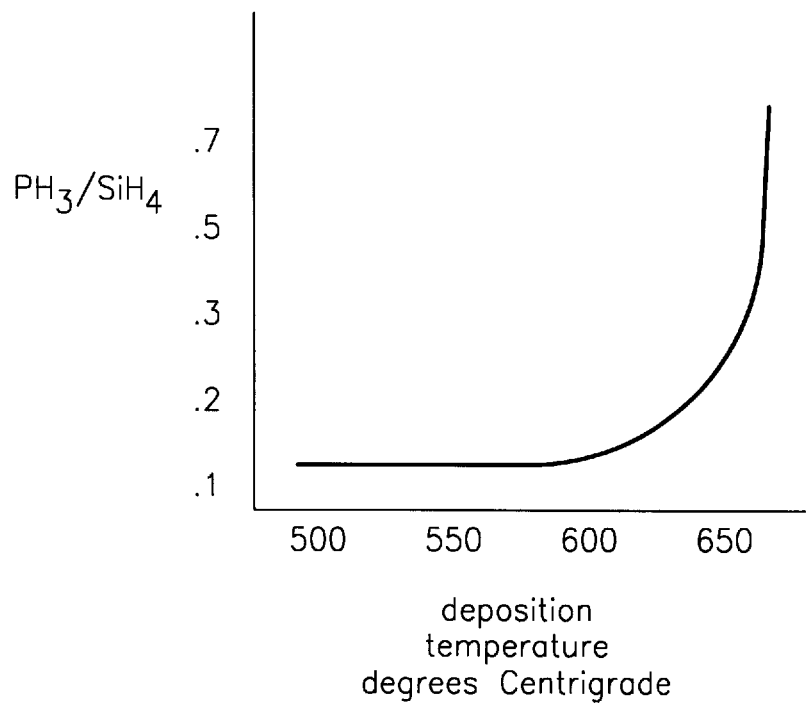
FIG. 13 shows the relationship between deposition temperature and the required ratio of phosphene ($PH_3$) and silane ($SiH_4$) to obtain a specified concentration of P in the device.
Figure 14:
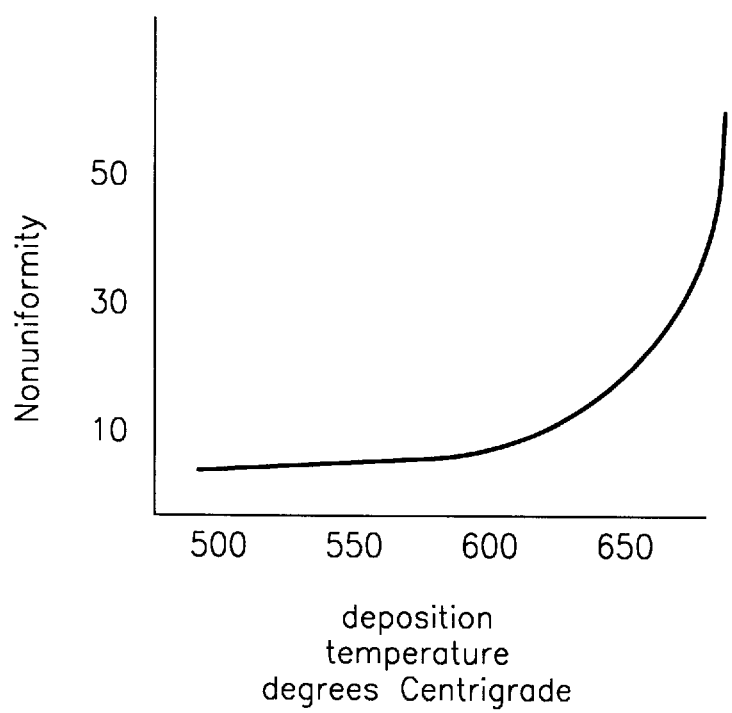
FIG. 14 shows the relationship between nonuniformity of the dopant in the device and the deposition temperature.

FIG. 8 shows a conventional method of obtaining a doped polysilicon gate with phosphene introduced into the silane stream, indicated by arrows 800 forming a layer of amorphous silicon 802 that forms the polysilicon gate. However, this method results in areas on the gate oxide surface having high concentrations of phosphorus. The high concentrations of phosphorus degrades the oxide leading to early failure. This problem is particularly acute in memory devices and will cause a high rate of failure. To solve this problem, manufacturers have lightly doped the deposited gate material. However, this has resulted in P depletion in the gate polysilicon. As discussed above, the trend is to deposit amorphous silicon on the gate oxide so that a more conformal layer can be obtained in order to negate faults on the gate oxide layer. However, to obtain polysilicon a high temperature anneal is required and in conventional prior art devices, the high anneal temperature causes the grain size to increase thus negating the primary advantage of the amorphous silicon. FIG. 13 illustrates the relationship between the required ratio of phosphene ($PH_3$) to silane $SiH_4$ versus deposition temperature in degrees Centigrade to obtain a specified concentration of P (phosphorus) in the gate. As can be seen from the relationship the higher the deposition temperature the higher the required ratio. FIG. 14 illustrates the nonuniformity of the P concentration as it varies with deposition temperature. As can be seen from the relationship the higher the deposition temperature the more nonuniform the concentration of P in the gate and at the gate/gate oxide interface.

Figure 9:
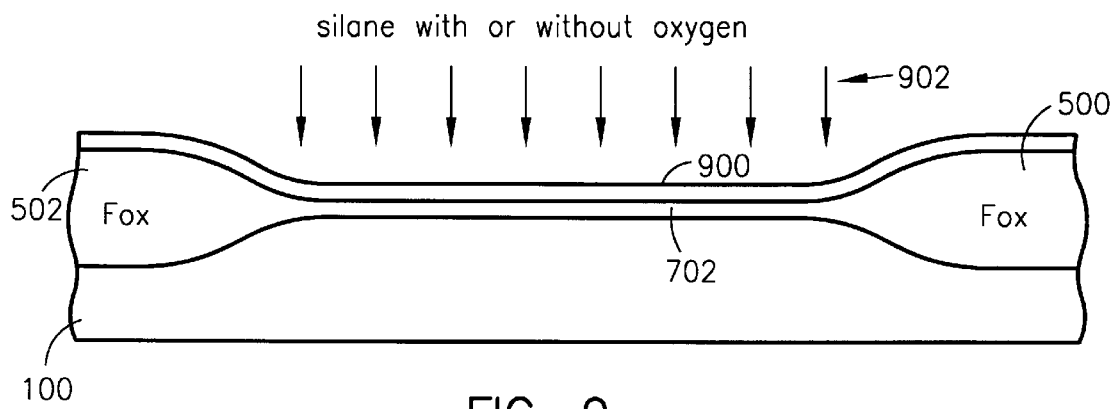
FIG. 9 shows a layer of undoped amorphous silicon formed on the tunnel oxide layer with or without oxygen in the silane stream.

FIG. 9 illustrates the deposition of a layer of undoped amorphous silicon 900 on the gate oxide layer 702. The layer of undoped amorphous silicon 900 typically has a thickness of less than 500 Angstroms. The stream of silicon source gas, such as silane or dichlorosilane, indicated by arrows 902, may or may not have an oxygen containing gas injected into the stream. The oxygen containing gas could be, for example, oxygen itself or an oxide of nitrogen. The injection of oxygen into the stream of silicon source gas at a concentration on the order of parts per thousand provides that the grain size in the amorphous silicon remains small thus maintaining the conformality of the layer.

Figure 10:
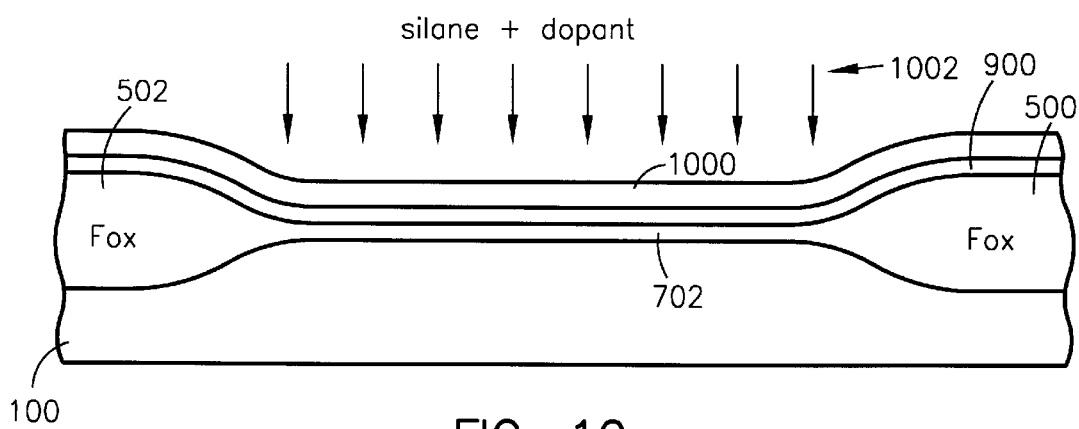
FIG. 10 shows a layer of doped amorphous silicon formed on the tunnel oxide layer without oxygen in the silane stream forming the layer of doped amorphous silicon.

FIG. 10 shows the deposition of the second layer of amorphous silicon 1000 on the first amorphous silicon layer 900. The second layer of amorphous silicon 1000 typically has a thickness of greater than 300 Angstroms. The total combined thickness of the first layer of amorphous silicon 900 and the second layer of amorphous silicon 1000 is a predetermined thickness dependent upon the process used and the application in which the device is to be used and can range from approximately 800 Angstroms to over 2000 Angstroms. The stream of silicon source gas, indicated by arrows 1002, depositing the second layer of amorphous silicon 1000 is injected with an appropriate dopant, such as phosphene. Alternatively, the second layer of amorphous silicon 1000 can be implanted with the appropriate dopant in situ. The dopant concentration is typically less than $5 \times 10^{20}$ atoms/cm$^3$.

Figure 11:
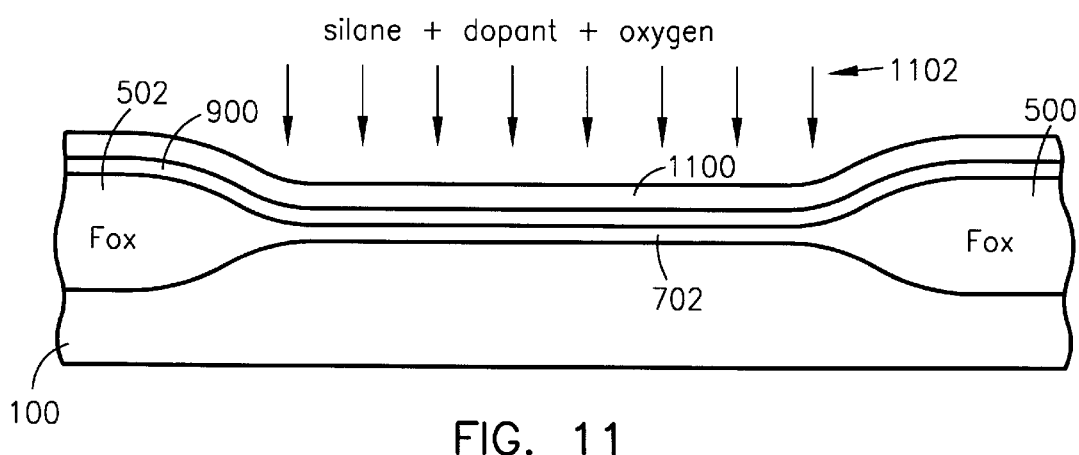
FIG. 11 shows a layer of doped amorphous silicon formed on the tunnel oxide layer with oxygen in the silane stream forming the layer of doped amorphous silicon.

FIG. 11 shows the deposition of the second layer of amorphous silicon 1100 on the first amorphous silicon layer 900. The stream of silicon source gas, such as silane or dichlorosilane, indicated by arrows 1102, depositing the second layer of amorphous silicon 1100 is injected with an appropriate dopant, such as phosphene. In addition, the stream of silicon source gas 1102 is injected with an oxygen containing gas. The concentration of oxygen in the stream of silicon source gas 1102 is on the order of parts per thousand and is at a concentration which avoids the formation of silicon oxide during the formation of the amorphous silicon layer.

Figure 12:
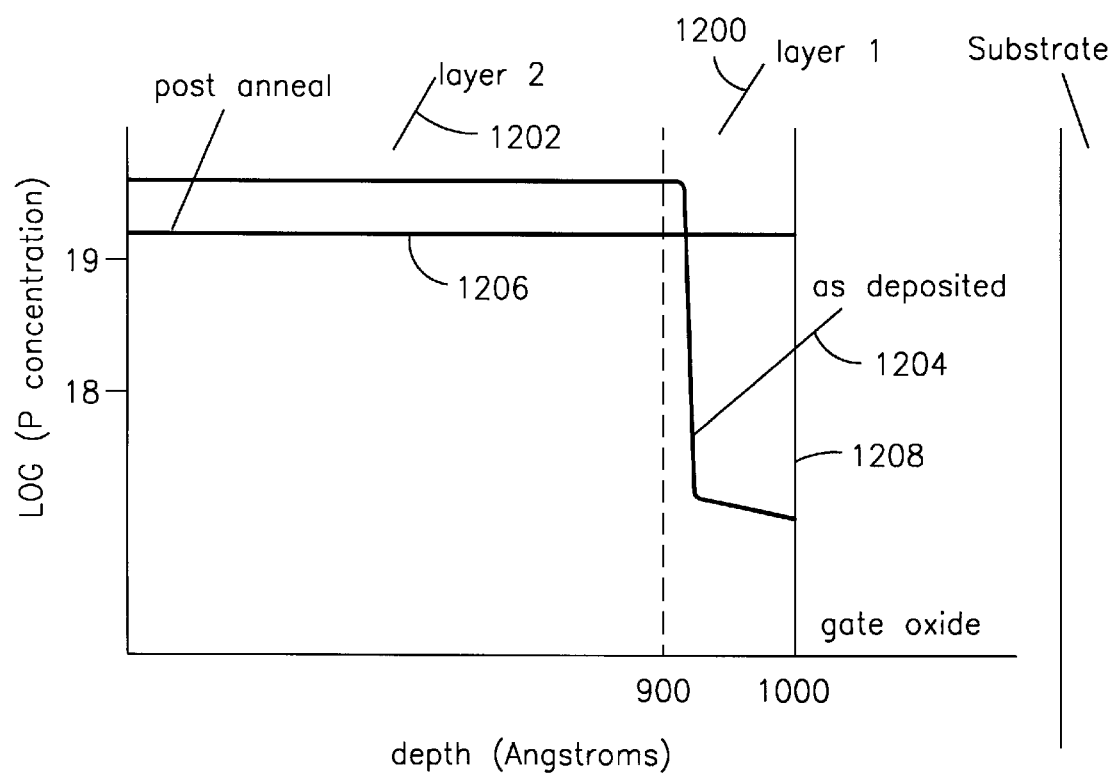
FIG. 12 the concentration of phosphorus (P) versus depth in layer 1 and layer 2 as deposited and post anneal.

The first and second layer shown in FIG. 11, for example, can be deposited as one continuous process. The first layer can be deposited with or without an oxygen containing gas and with or without a dopant and at the appropriate time in the process the stream of silicon source gas can be injected with the appropriate dopant and/or oxygen without stopping the process. FIG. 12 shows the relationship between concentration of P (phosphorus) in the first layer 1200 and the second layer 1202 as deposited, indicated by curve 1204, and post anneal, indicated by curve 1206. Curve 1206 indicates the ideal concentration in the first and second layer with no concentration beyond the interface between layer 1 1200 and the gate oxide 1208.

The foregoing description of the preferred embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications which are suited to the particular use contemplated. All such modifications and variations are within the scope of the invention as determined by the appended claims when interpreted in accordance with the breadth to which they are fairly, legally, and equitably entitled.

What I claim is:

1. A method of manufacturing a semiconductor device, the method comprising:

forming a layer of gate oxide on a surface of a silicon substrate;

forming a first layer of an oxygen containing amorphous silicon having a first thickness on the layer of gate oxide wherein the first layer of oxygen containing amorphous silicon is formed by injecting an oxygen containing gas into a stream of silicon source gas directed at a surface of the gate oxide; and forming a second layer of an oxygen containing doped amorphous silicon having a second thickness on the first layer of an oxygen containing amorphous silicon wherein the second layer of oxygen containing doped amorphous silicon is formed by injecting an oxygen containing gas into a stream of silicon source gas directed at a surface of the first layer of an oxygen containing amorphous silicon.

2. The method of claim 1 wherein the first thickness is less than 500 Angstroms.

3. The method of claim 1 wherein forming the second layer of an oxygen containing doped amorphous silicon comprises doping the second layer of an oxygen containing doped amorphous silicon with a dopant material having a concentration of less than $5 \times 10^{20}$ atoms/cm$^3$.

4. The method of claim 2, wherein forming the second layer of an oxygen containing doped amorphous silicon is accomplished by forming the second layer of an amorphous silicon containing doped amorphous silicon with the second thickness that is complementary to the first thickness of the first layer of oxygen containing amorphous silicon to achieve a total thickness of the first layer of oxygen containing amorphous silicon and the second layer of oxygen containing doped amorphous silicon combined.

5. The method of claim 4, wherein the total thickness is approximately 800 Angstroms.

6. The method of claim 5, wherein the second thickness of the second layer of oxygen containing doped amorphous silicon is greater than 300 Angstroms.

7. The method of claim 6, wherein the oxygen containing gas is injected into the stream of silicon source gas directed at a surface of the gate oxide with a concentration that avoids the formation of silicon oxide during the formation of the first layer of an oxygen containing amorphous silicon.

8. The method of claim 7, wherein the oxygen containing gas is injected into the stream of silicon source gas directed at a surface of the first layer of an oxygen containing amorphous silicon with a concentration that avoids the formation of silicon oxide during the formation of the second layer of the oxygen containing doped amorphous silicon.

* * * * *